(12) United States Patent
Kim et al.

(10) Patent No.: US 7,842,337 B2
(45) Date of Patent: Nov. 30, 2010

(54) METHOD OF NANO-PATTERNING BLOCK COPOLYMERS AND METHOD OF MANUFACTURING POLARIZER AND COLOR FILTER USING THE SAME

(75) Inventors: Sang-ouk Kim, Daejeon (KR); Su-mi Lee, Yongin-si (KR); Moon-gyu Lee, Suwon-si (KR); Bong-hoon Kim, Seoul (KR); Dong-ok Shin, Seoul (KR)

(73) Assignees: Samsung Electronics Co., Ltd., Suwon-si (KR); Korea Advanced Institute of Science and Technology, Daejeon (KR)

( * ) Notice: Subject to any disclaimer, the term of this patent is extended or adjusted under 35 U.S.C. 154(b) by 374 days.

(21) Appl. No.: 12/025,949

(22) Filed: Feb. 5, 2008

(65) Prior Publication Data
US 2009/0004375 A1 Jan. 1, 2009

(30) Foreign Application Priority Data
Jun. 29, 2007 (KR) .................. 10-2007-0065688

(51) Int. Cl.
*B05D 5/06* (2006.01)

(52) U.S. Cl. .............. 427/163.1; 427/164; 427/165; 427/282; 427/287; 427/372.2; 359/580

(58) Field of Classification Search ............ 427/163.1
See application file for complete search history.

(56) References Cited

PUBLICATIONS

Kim et al., "Epitaxial self-assembly of block copolymers on lithographically defined nanopatterned substrates", Nature, vol. 424, pp. 411-414, Jul. 24, 2003.*
Kimura et al., "Self-assembled PS-PMMA nanodot array pattern arranged in a parallelogram guide", Material Research Society Symposium Proceedings, 2006.*

* cited by examiner

*Primary Examiner*—Michael Cleveland
*Assistant Examiner*—Lisha Jiang
(74) *Attorney, Agent, or Firm*—Sughrue Mion, PLLC

(57) ABSTRACT

Provided is a method of nano-patterning block copolymers and a method of manufacturing a polarizer using the same. The method of nano-patterning block copolymers includes coating block copolymers on a lower substrate to a predetermined thickness, forming a thickness gradient by patterning the block copolymers to have a predetermined aspect ratio, and aligning self-assembled block copolymers in a direction of the thickness gradient by heat-treating the block copolymers having the thickness gradient.

32 Claims, 18 Drawing Sheets

METHOD OF NANO-PATTERNING BLOCK COPOLYMERS AND METHOD OF MANUFACTURING POLARIZER AND COLOR FILTER USING THE SAME

CROSS-REFERENCE TO RELATED PATENT APPLICATION

This application claims the benefit of Korean Patent Application No. 10-2007-0065688, filed on Jun. 29, 2007, in the Korean Intellectual Property Office, the disclosure of which is incorporated herein in its entirety by reference.

BACKGROUND OF THE INVENTION

1. Field of the Invention

The present technical concept relates to a method of nano-patterning block copolymers in order to align the block copolymers in a desired direction and a method of manufacturing a polarizer and a color filter using the method of nano-patterning block copolymers.

2. Description of the Related Art

Block copolymers are representative self-assembling materials composed of covalently linked macromolecular blocks. Owing to the diverse chemical functionalities, parallel nanostructure formation and precise tunability over the shape and size of the nanostructures, block copolymers have been widely applied as template materials for nanofabrication. A bottom-up development method using a nano structure formed by self-alignment of block copolymers is more economical than a top-down development method such as photolithography, and an ultra-fine nano structure less than 30 nm, which cannot be obtained by the top-down development method, can be prepared by the bottom-up development method.

However, the spontaneously assembled morphology of a block copolymer consists of randomly oriented nanodomains with a large number of defects. For diverse advanced applications such as the templates for optical elements, sensor array or nanofluidics, control over the orientation and ordering of nanodomains over a large area is required, particularly in thin films.

To date, various strategies such as the application of external fields, templated assembly upon prepatterned surfaces, directional solidification, or physical/chemical surface treatment have been exploited for the well-ordered nanoscale morphologies of block copolymers.

However, most of those approaches require complicated geometric set-ups or multi-step processes, thus practically limiting the application to a large area.

SUMMARY OF THE INVENTION

The present technical concept provides a method of nano-patterning block copolymers in order to align the block copolymers in a desired direction by forming a thickness gradient of the block copolymers and a method of manufacturing a polarizer using the method of nano-patterning block copolymers.

According to an aspect of the present technical concept, there is provided a method of nano-patterning block copolymers, the method comprising:

(a) coating block copolymers on a lower substrate to a predetermined thickness;

(b) forming a thickness gradient by patterning the block copolymers to have a predetermined aspect ratio; and (c) aligning self-assembled block copolymers in a direction of the thickness gradient by heat-treating the block copolymers having the thickness gradient.

According to another aspect of the present technical concept, there is provided a method of nano-patterning block copolymers, the method comprising:

(a) coating a sacrificial layer on a lower substrate;

(b) patterning a plurality of barrier ribs and channels on the sacrificial layer using a photomask;

(c) forming a plurality of barrier ribs and channels by etching the sacrificial layer;

(d) forming a hydrophobic layer to surround the plurality of the barrier ribs;

(e) forming a thickness gradient by filling block copolymers in the plurality of channels to have a predetermined aspect ratio; and (f) aligning self-assembled block copolymers in a direction of the thickness gradient by heat-treating the block copolymers having the thickness gradient.

According to another aspect of the present technical concept, there is provided a method of manufacturing a polarizer, the method comprising:

(a) coating block copolymers including blocks combined with a metal on a substrate;

(b) forming a thickness gradient by patterning the block copolymers to have a predetermined aspect ratio;

(c) aligning self-assembled block copolymers in a direction of the thickness gradient by heat-treating the block copolymers having the thickness gradient; and (d) removing blocks other than the blocks combined with particles of the metal.

According to another aspect of the present technical concept, there is provided a method of manufacturing a polarizer, the method comprising:

(a) coating block copolymers in which at least two blocks are combined on a substrate;

(b) forming a thickness gradient by patterning the block copolymers to have a predetermined aspect ratio;

(c) aligning self-assembled block copolymers in a direction of the thickness gradient by heat-treating the block copolymers having the thickness gradient;

(d) removing one of the blocks included in the block copolymers;

(e) coating a metal material layer to a predetermined thickness on the block copolymers in which one of the blocks is removed;

(f) patterning the metal material layer using a lift off process; and (g) removing the other blocks.

According to another aspect of the present technical concept, there is provided a method of manufacturing a polarizer, the method comprising:

(a) coating block copolymers in which at least two blocks are combined on a substrate;

(b) forming a thickness gradient by patterning the block copolymers to have a predetermined aspect ratio;

(c) aligning self-assembled block copolymers in a direction of the thickness gradient by heat-treating the block copolymers having the thickness gradient;

(d) removing one of the blocks included in the block copolymers; and (e) electroplating a portion from which the block was removed.

According to another aspect of the present technical concept, there is provided a method of manufacturing a color filter, the method comprising:

(a) forming black matrixes on a substrate;

(b) forming a hydrophobic layer to surround the black matrixes;

(c) forming a thickness gradient to have a predetermined aspect ratio by filling block copolymers in space defined by the black matrixes;

(d) aligning self-assembled block copolymers in a direction of the thickness gradient by heat-treating the block copolymers having the thickness gradient;

(f) removing one of the blocks included in the block copolymers and forming a polarizer; and (g) filling a color ink in the space in which the polarizer is formed.

BRIEF DESCRIPTION OF THE DRAWINGS

The above and other features and advantages of the present technical concept will become more apparent by describing in detail exemplary embodiments thereof with reference to the attached drawings in which.

DETAILED DESCRIPTION OF THE INVENTION

Hereinafter, the present technical concept will now be described more fully with reference to the accompanying drawings, in which exemplary embodiments of the invention are shown.

Figure 2A:
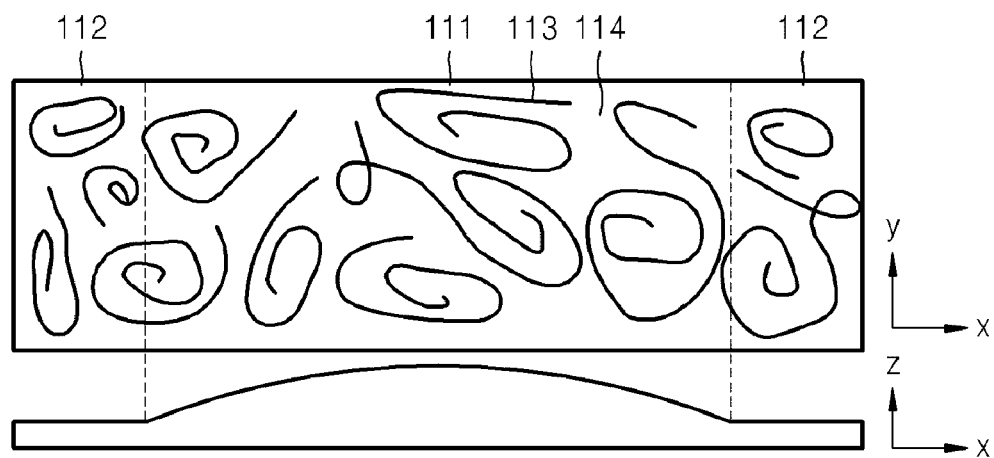
FIGS. 2A through 2C show the block copolymers of FIGS. 1A through 1D aligned during the nano-patterning.
Figure 2B:
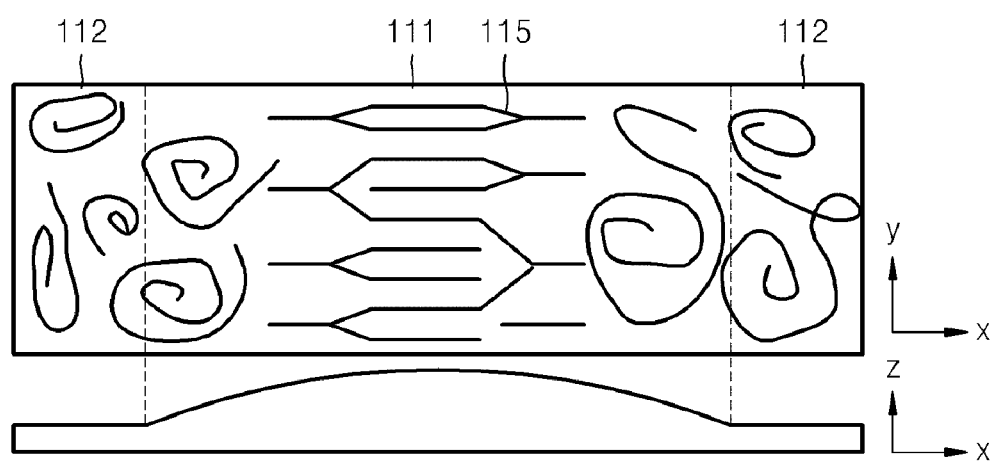
Figure 2C:
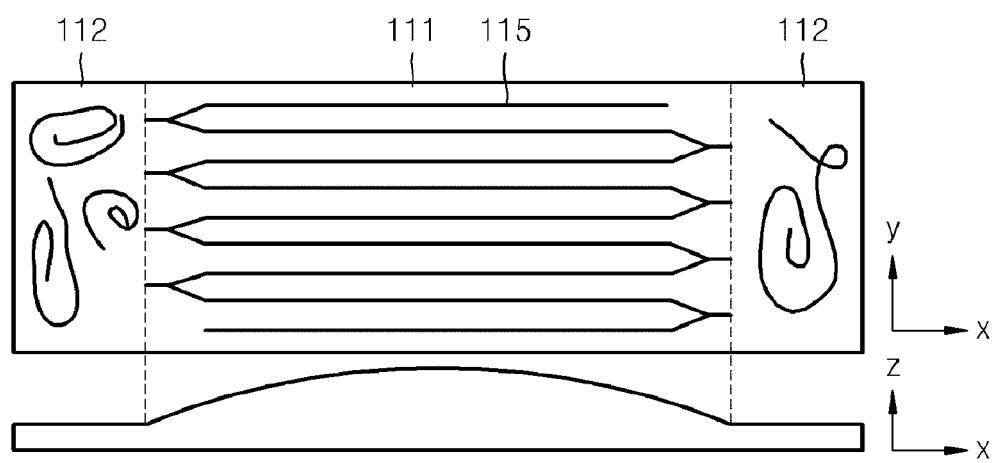
Figure 3:
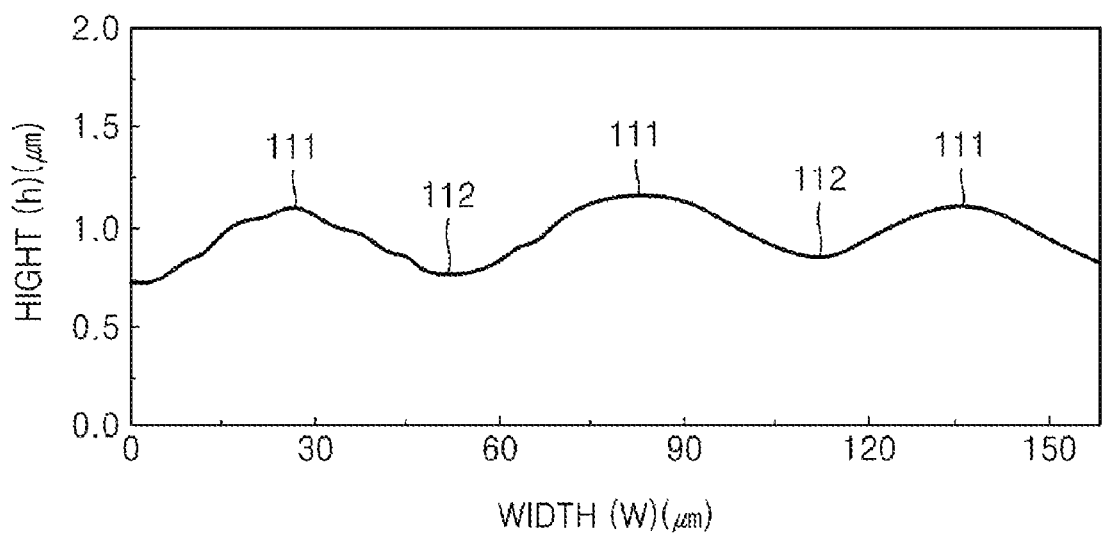
FIG. 3 shows a graph of a thickness gradient of the block copolymers of FIGS. 1A through 1D during the nano-patterning.
Figure 4:
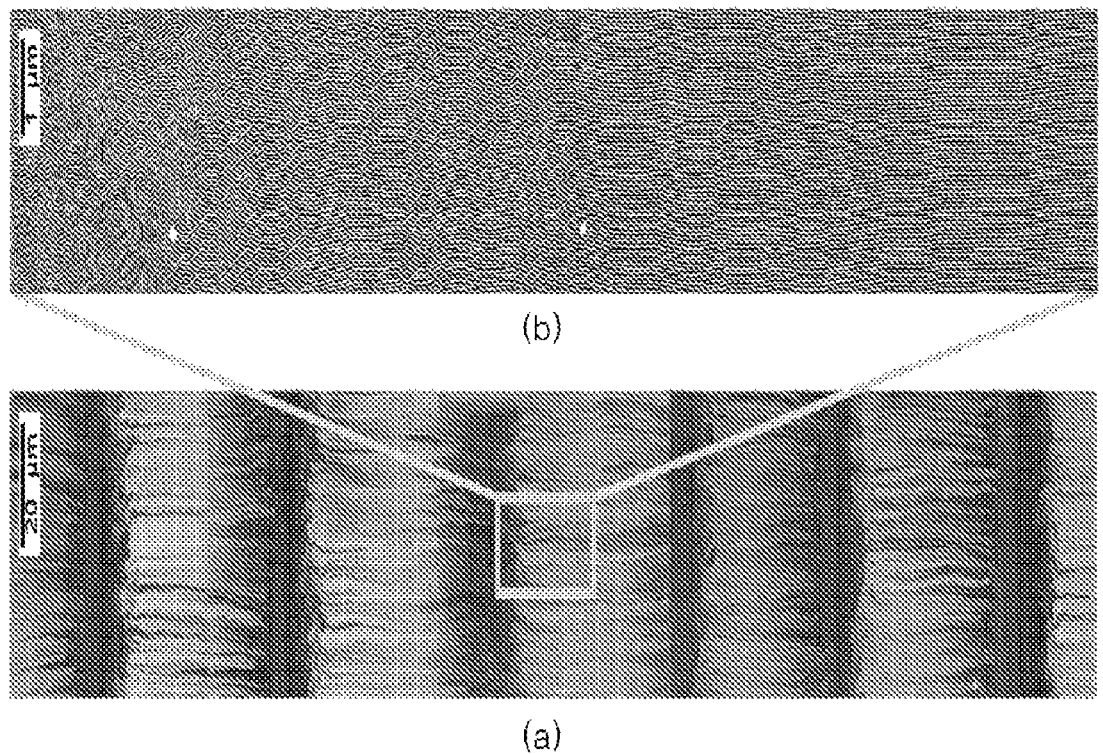
FIGS. 4A and 4B show scanning electron microscope (SEM) images of the block copolymers of FIGS. 1A through 1D aligned during the nano-patterning.
Figure 5:
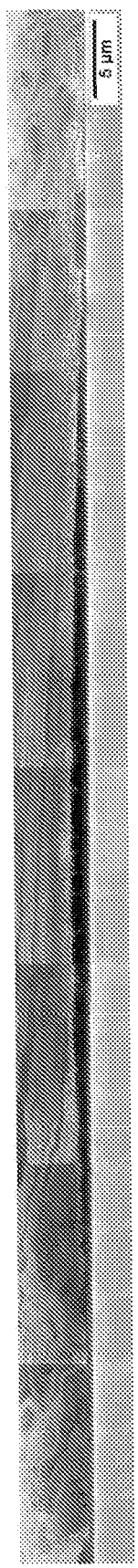
FIG. 5 shows a SEM image of the block copolymers of FIGS. 1A through 1D aligned during the nano-patterning from another angle.

FIGS. 1A through 1D show a method of nano-patterning block copolymers according to an embodiment of the present technical concept. FIGS. 2A through 2C show the block copolymers of FIGS. 1A through 1D aligned during the nano-patterning. FIG. 3 shows a graph of a thickness gradient of the block copolymers of FIGS. 1A through 1D during the nano-patterning. FIGS. 4A and 4B show scanning electron microscope (SEM) images of the block copolymers of FIGS. 1A through 1D aligned during the nano-patterning. FIG. 5 shows a SEM image of the block copolymers of FIGS. 1A through 1D aligned during the nano-patterning from another angle.

In the method of nano-patterning block copolymers, a thickness gradient is formed in block copolymers to align block copolymers in a desired direction. A difference among the defect decay rates of the block copolymers depending on the thickness gradient induces a lamella domain to be grown and aligned in a desired direction.

According to the method of nano-patterning block copolymers of the present technical concept, large scale ordering was defined by a periodic array of microscale stripes self-organized from the receding contact line of an evaporating block copolymer solution. Its length scale was tunable over the tens of the micrometers scale by adjusting patterning process. Small scale ordering corresponds to the self-assembled nanostructure of a block copolymer. Its length scale was determined by the chemical structure of the block copolymer. The large scale structure directs the ordering of the small scale structure in this approach. This offers a unique opportunity to attain control over nanoscale morphology by manipulating a microscale structure.

Figure 1A:
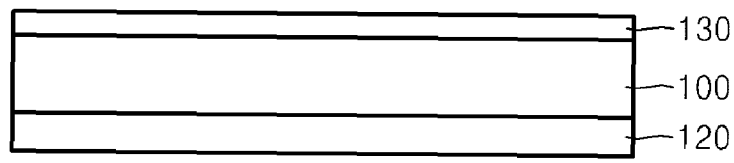
FIGS. 1A through 1D show a method of nano-patterning block copolymers according to an embodiment of the present technical concept.

Referring to FIG. 1A, poly(styrene-b-methyl methacrylate) (PS-b-PMMA), which is a symmetrical diblock copolymer (hereinafter, block copolymer) having a molecular weight of 52,000 kg/mol with lamellar spacing of 48 nm, is dissolved in toluene to create a 3.5 wt % block copolymer solution 100, and the block copolymer solution 100 is sandwiched between a lower substrate 120 (silicon wafer) and an upper substrate 130 (glass). Surfaces of the lower substrate 120 and the upper substrate 130 contacting the block copolymer solution 100 are neutrally treated, and thus have the same interfacial tension to the PS and PMMA. Accordingly, lamellae of the self-assembled block copolymers are aligned in a direction perpendicular to the surface along the thickness direction, i.e., in the Z direction.

Figure 1B:
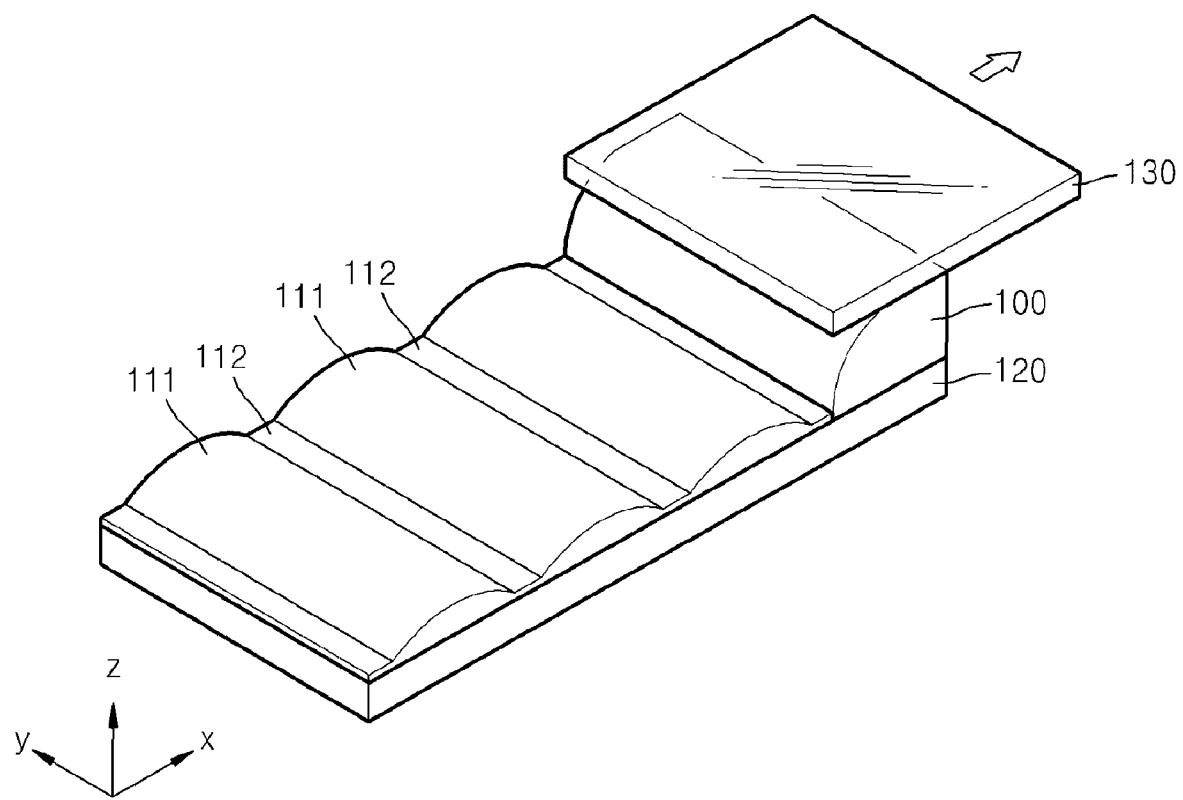
Figure 1C:
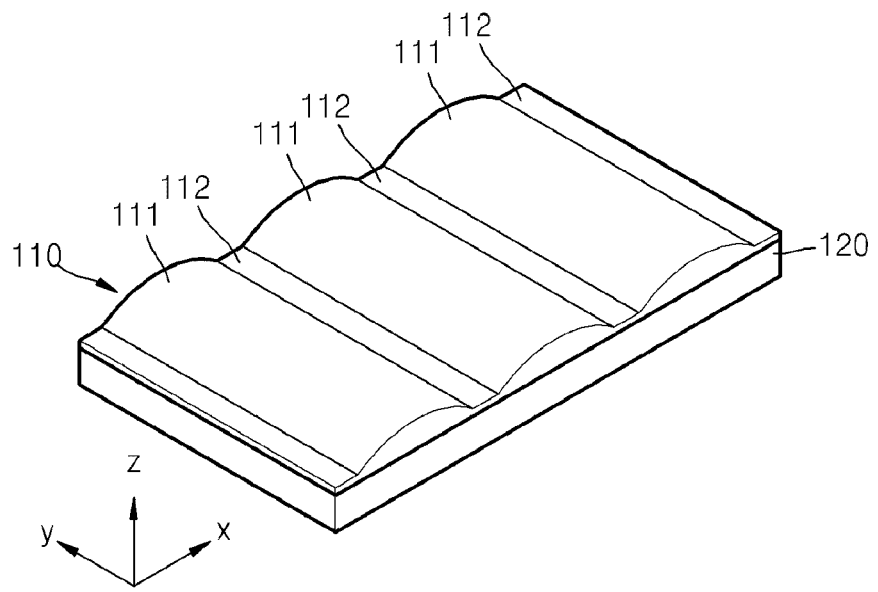

Referring to FIGS. 1B and 1C, an example of the method of macroscopically aligning the block copolymer solution 100 by forming a thickness gradient in the block copolymer solution 100 is a pinning and depinning method.

That is, a block copolymer thin film 110 having a convex portion 111 having a predetermined thickness and a flat portion 112, which thinner than the convex portion 111, is formed by repeating depinning and pinning of the upper substrate 130 in the arrow direction at a constant speed. Whenever the upper substrate 130 is depinned, the convex portion 111 is formed, and whenever the upper substrate 130 is pinned, the flat portion 112 is formed.

FIG. 3 shows heights and widths of the convex portion 111 of the block copolymer (PS-b-PMMA). The greatest thickness of the block copolymer is 1.4 µm, and an aspect ratio, which is a ratio of width to height, is about 55.

Various kinds of block copolymers in addition to PS-b-PMMA may be applied, and a block polymer to which the nano-patterning of the present technical concept is applied may have an aspect ratio of the convex portion 111 in the range of 1:200 to 1:1. A thickness of the block copolymer thin film 110 can be adjusted by controlling the speed of the upper substrate 130. For example, as the upper substrate 130 is speeded up, the convex portion 111 of the block copolymers thin film 110 becomes thinner. On the other hand, as the upper substrate 130 is slowed down, the convex portion 111 of the block copolymers thin film 110 becomes thicker.

The total molecular weight of the block copolymer may be in the range of 10,000 to 300,000. Examples of the block copolymer include poly(styrene-b-butadiene) (PS-b-PB), poly(styrene-b-isoprene) (PS-b-PI), poly(styrene-b-ethylene propylene) (PS-b-PEP), poly(styrene-b-dimethylsiloxane) (PS-b-PDMS), poly(styrene-b-ethylene) (PS-b-PE), poly(styrene-b-vinylpyridine) (PS-b-P2VP), poly(styrene-b-vinylpyridine) (PS-b-P4VP), poly(isoprene-b-ferrocenyldimethylsilane) (PI-b-PFS), and poly(styrene-b-ethyleneoxide) (PS-b-PEO).

Figure 1D:
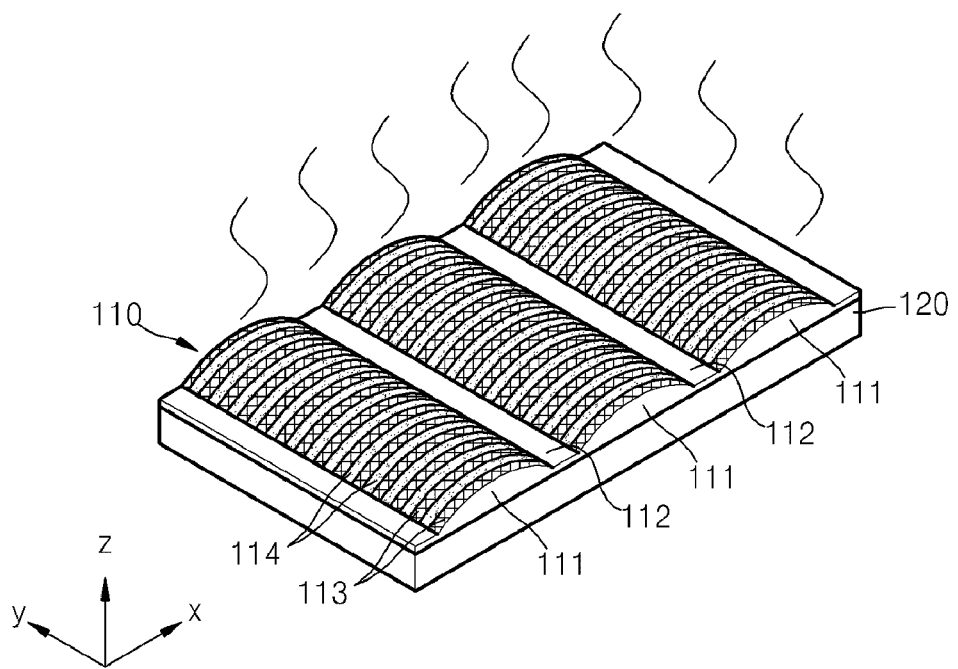

Referring to FIG. 1D, the block copolymers thin film 110 having the thickness gradient is annealed at a high temperature. Then, two polymers 113 and 114 composing the block copolymer are aligned in the lengthwise direction, i.e., in the X direction, and alternately aligned in the widthwise direction, i.e., in the Y direction.

More specifically, as shown in FIG. 2A, in the block copolymer solution 100 in which the convex portion 111 and the flat portion 112 are alternately formed using a pinning and depinning method, two polymers 113 and 114 are irregularly aligned. The two polymers 113 and 114 may be poly stylrene (PS) and poly methylmethacrylate (PMMA), and the arranged order is not critical.

As shown in FIG. 2B, a well-arranged lamella 115 gradually grows in the lengthwise direction, i.e., in the X direction, from the convex portion 111 when the heat-treatment is performed. When the heat-treatment is further performed, the lamella 115 grows to the border of the flat portion 112 as shown in FIG. 2C.

The heat-treatment may be performed at 190° C. When the temperature of the heat-treatment is higher than a glass transition temperature (Tg), combustion may occur since the block copolymer is combined with oxygen, although this can vary upon vacuum conditions. Thus, the temperature of the heat-treatment may be less than Tg.

Such a directional domain growth was caused by the influence of film thickness upon the defect annihilation rate. Since lamellae were oriented perpendicularly to the substrate surface, the defect morphology at the film surface penetrated throughout the film thickness. Therefore, the defect energy given by the core energy and the energy penalty for the morphology distortion around the core was proportional to the film thickness. The influence of film thickness upon the defect energy imposed the gradient in defect annihilation rate along the thickness gradient. As a consequence, a well-ordered domain was nucleated at the thickest part of the film and propagated following thickness gradient upon an isothermal annealing process.

When the block copolymers thin film 110 is thicker, the defects annihilation rate faster since the energy of the defects increases according to the thickness. On the other hand, when the block copolymers thin film 110 is thinner, the defects annihilation rate slower. Thus, when the block copolymers thin film 110 has a thickness gradient, a directional domain growth in which an arranged domain is formed from the thickest region and grows toward the thinnest region is formed.

Since the defects annihilation by being combined with other defects, the defects within the well-aligned lamella 115 or on the border (mostly electric potentials) operate with defects outside of the well-aligned lamella 115 and the defects annihilation along the thickness gradient. The mobility of a defect is higher in the lamellar parallel direction (climb) than in the lamellar perpendicular direction (glide). The movement in the lamellar parallel direction requires the simple diffusion of polymer molecules, whereas the movement in the lamellar perpendicular direction accompanies the sequential breakage and recombination of adjacent lamellae, which creates a high energy penalty. Due to the anisotropic mobility, the propagation of defects along a thickness gradient raised the spontaneous alignment of lamellae in the same direction.

Referring to FIG. 4A, a region in which the lamella 115 is aligned in the lengthwise direction, i.e., in the X direction, is the convex portion 111, a dark region between the convex portions 111 is the flat portion 112. Referring to FIG. 4B, which shows a magnified image of a part of the convex portion 111 and the flat portion 112, the lamella 115 is aligned in the lengthwise direction, i.e., in the X direction in the convex portion 111, but irregularly aligned in random directions in the flat portion 112.

In addition, referring to FIG. 5, a region in which the lamella is aligned in the lengthwise direction, i.e., in the X direction, is the convex portion, and a region in which the lamella is irregularly aligned in random directions is the flat portion.

According to FIGS. 1 through 5, the thin film 110 alternately having the thick convex portion 111 and the thin flat portion 112 is formed by the pinning and depinning method, and the lamella 115 is aligned in the lengthwise direction in the convex portion 111 by heat-treatment. Since the lamella 115 is aligned in the lengthwise direction in the convex portion 111 and irregularly aligned in random directions in the flat portion 112, the flat portion 112 may be minimized and only the convex portion 111 may be formed.

Figure 6:
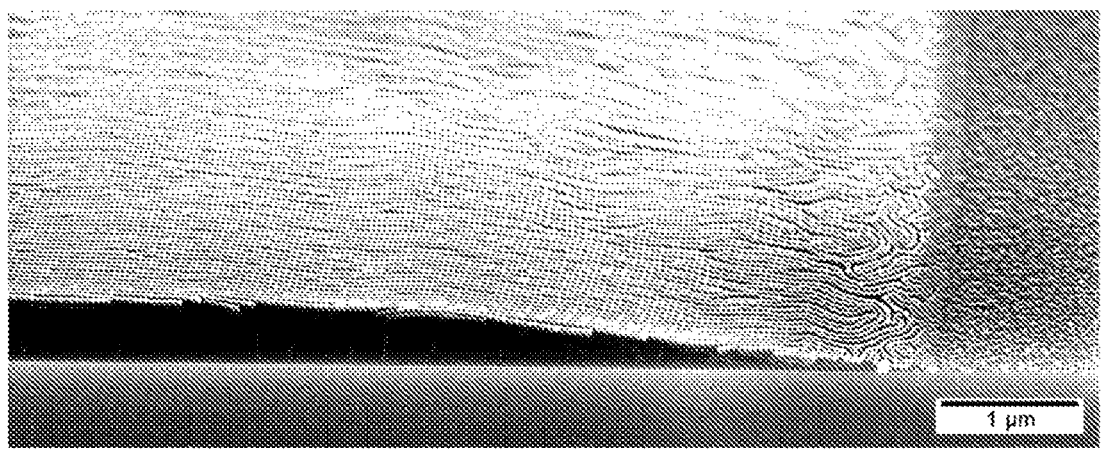
FIG. 6 shows a SEM image of block copolymers being aligned according to another embodiment of the present technical concept.

FIG. 6 shows a SEM image of block copolymers aligned according to another embodiment of the present technical concept.

Referring to FIG. 6, the region in which the lamella is not aligned is minimized by minimizing the thickness of the flat portion shown in FIG. 1B and forming the convex portion to have very small thickness at its ends. This can be obtained by controlling the movement of the upper substrate 130 during the pinning and depinning method.

Meanwhile, the pinning and depinning method was used as a method of forming a thickness gradient of the block copolymers in FIG. 1. However, the thickness gradient can be formed in the block copolymers using a method of imprinting a pattern having a thickness gradient on a block copolymer film which is uniformly coated with a predetermined thickness using nano-imprinting, a method of forming barrier ribs having a predetermined height using photolithography and applying a material having low affinity for the block copolymers, i.e., a hydrophobic material, to the barrier ribs, or the like.

Figure 7A:
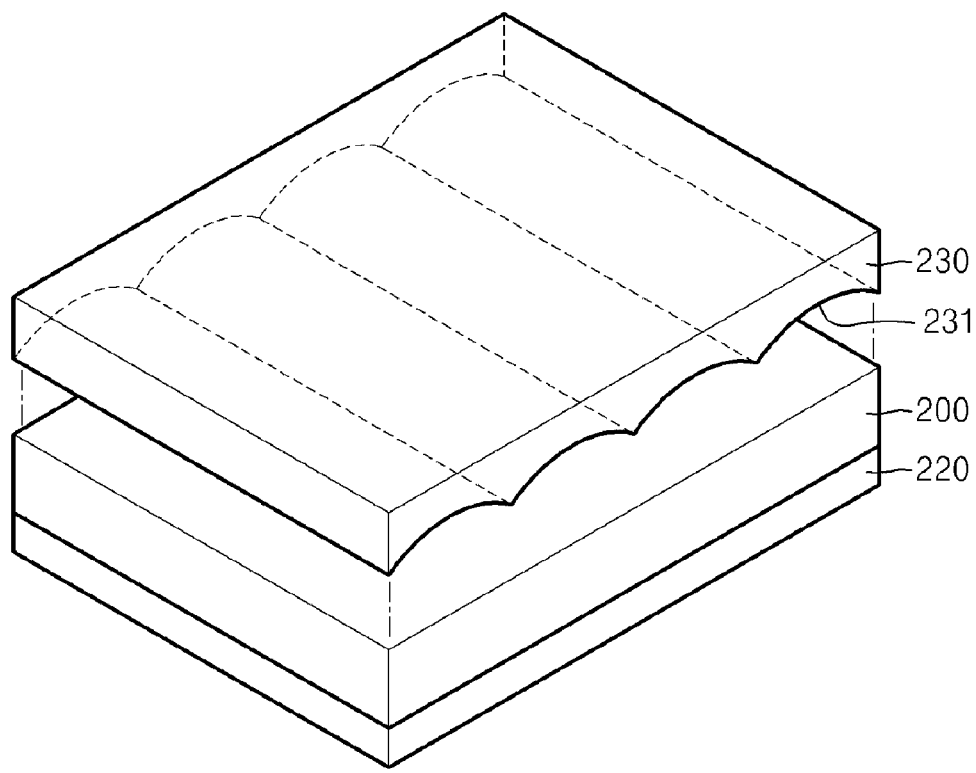
FIGS. 7A and 7B show a method of forming a thickness gradient of block copolymers using nano-imprinting.
Figure 7B:
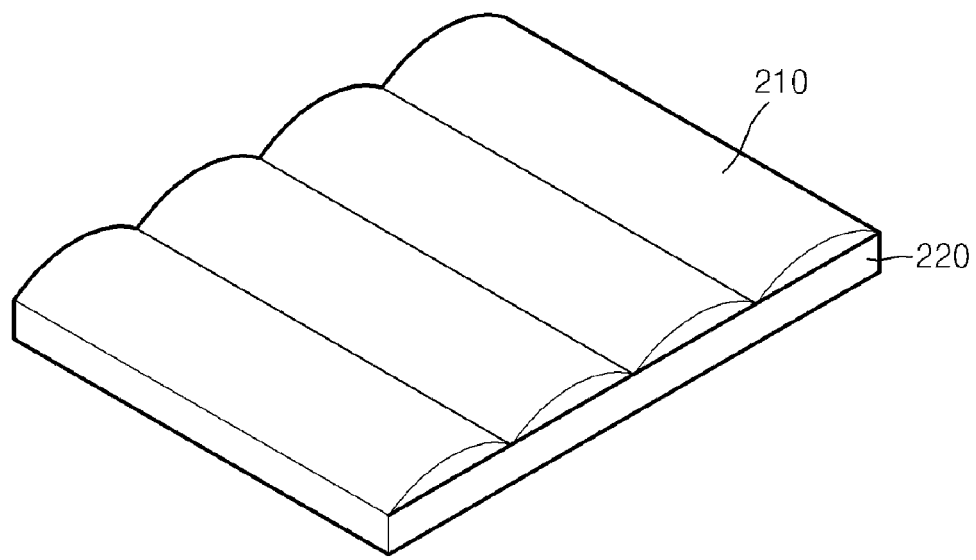

FIGS. 7A and 7B show a method of forming a thickness gradient of block copolymers using nano-imprinting.

Referring to FIG. 7A, a block copolymers solution 200 is coated on a lower substrate 220 as a thin film to a predetermined thickness. A module 230 in which a pattern 231 having a thickness gradient is imprinted on the block copolymer solution 200. Then, a thickness gradient corresponding to the pattern 231 of the module 230 is formed in the block copolymer solution 200 and a block copolymer thin film 210 is formed as shown in FIG. 7B.

Figure 8A:
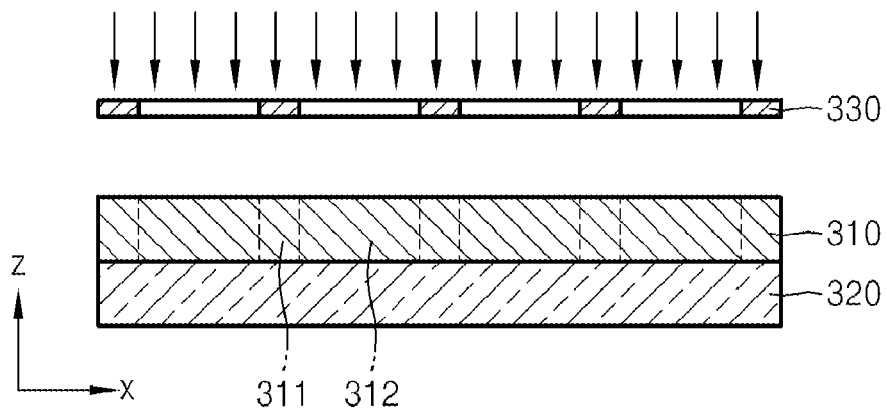
FIGS. 8A through 8C show a method of forming a thickness gradient of block copolymers using photolithography.
Figure 8B:
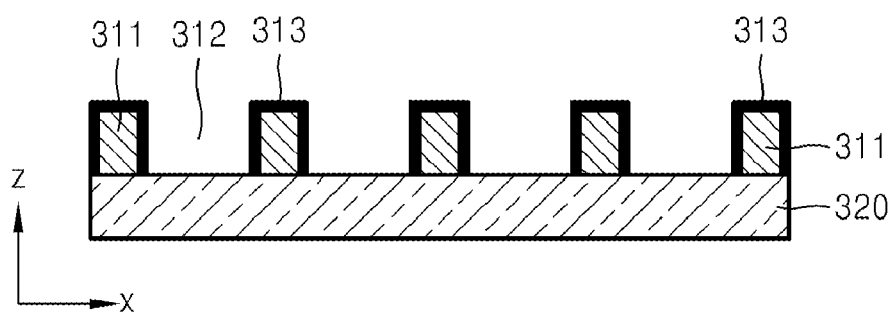
Figure 8C:
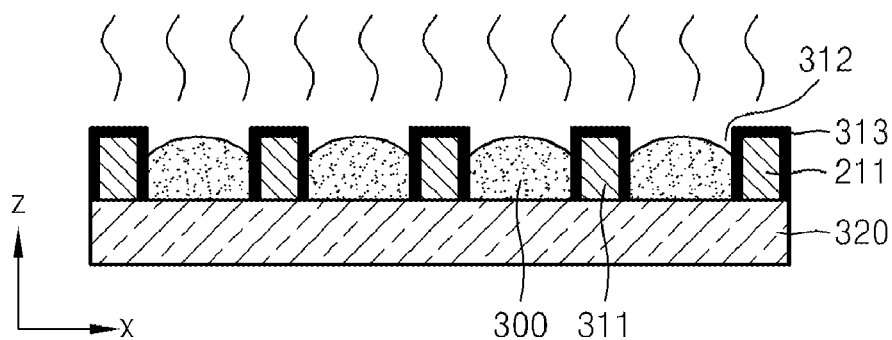

FIGS. 8A through 8C show a method of forming a thickness gradient of block copolymers using photolithography.

Referring to FIG. 8A, a sacrificial layer 310 is coated on a lower substrate 320 as a thin film to a predetermined thickness. Then, the sacrificial layer 310 is covered with a photomask 330 in which the barrier ribs are patterned, and UV light is irradiated on the photomask 330 to pattern a plurality of barrier ribs 311 and a plurality of channels 312 which are surrounded by the barrier ribs 311 on the sacrificial layer 310.

Referring to FIG. 8B, the sacrificial layer 310 corresponding to the plurality of channels 312 is etched to form the channels 314, and then a hydrophobic layer 313 is formed to surround the barrier ribs 311. The hydrophobic layer 313 is formed of a material having low affinity to the block copolymers.

Referring to FIG. 8C, when the plurality of channels 312 is filled with the block copolymer solution 300, a contact angle between the block copolymer solution 300 and the hydrophobic layer 313 increases since the block copolymer solution 300 does not have affinity for the hydrophobic layer 313, and thus a thickness gradient is formed in the lengthwise direction, i.e., in the X direction.

Here, the width of the barrier ribs 311 can be adjusted by controlling the photomask 330, and the contact angle between the block copolymer solution 300 and the hydrophobic layer 313 can also be controlled. Thus, the aspect ratio of the block copolymer solution 330, which is filled in the channel 312, can be adjusted by controlling the width and height of the block copolymers. Particularly, the region in which the lamella domain is not aligned can be minimized by minimizing the width of the barrier ribs 311 as shown in FIG. 6.

A method of forming a thickness gradient in the block copolymers using the photolithography can be applied to a color filter for a liquid crystal display (LCD). That is, a polarizer is formed by filling a block copolymer solution in a pixel defined by black matrixes to a predetermined thickness, forming a thickness gradient in the block copolymer solution, and self-assembling the block copolymer solution as described in an embodiment of the present technical concept. The LCD can be made slim and the costs for manufacturing it can be reduced by preparing LCD with an internal polarizer in which the polarizer is formed in the black matrixes. This will be described in more detail later.

Figure 9:
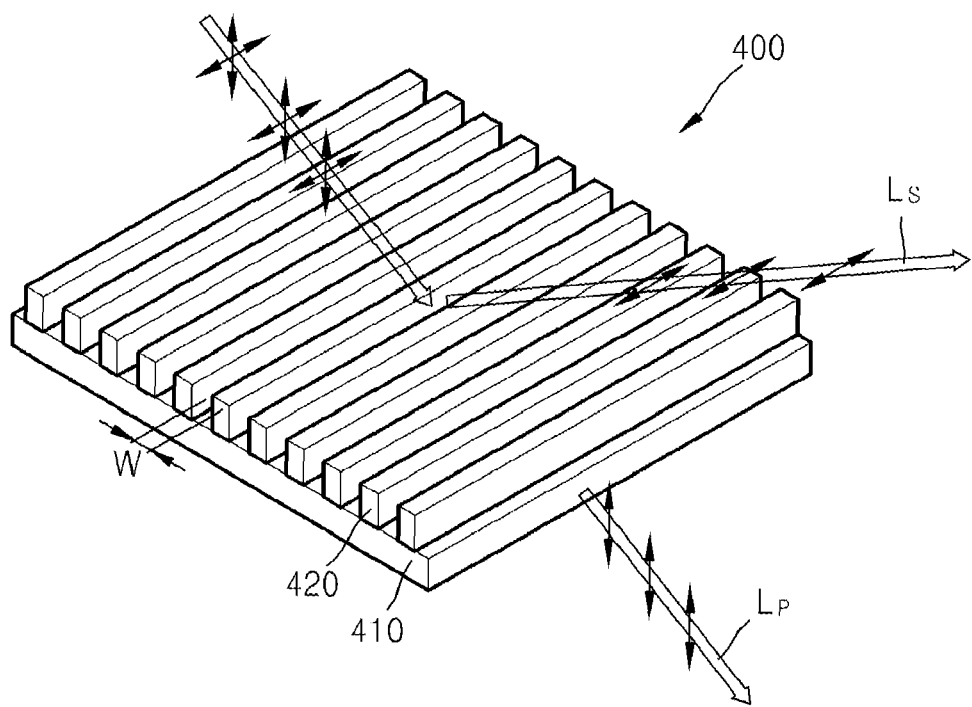
FIG. 9 shows a perspective view of a conventional polarizer.

FIG. 9 shows a perspective view of a conventional polarizer.

Referring to FIG. 9 a polarizer 400 (wire grid polarizer) includes a substrate 410 and a plurality of long wire grids 420 formed of a metal and arranged at a far shorter interval than it's the polarizer's wavelength on the substrate 410. A polarization component (Ls) parallel to the wire grid 420 is reflected due to the properties of the metal, while an orthogonal polarization component (Lp) is transmitted through the wire grid 420 as an effective refraction medium. A minimum line width (W) of the wire grid 420 may be less than 50 nm in order to operate as a reflective polarizer within the visible ray range. However, it is difficult to use such a micro line width in the case of a large-area polarizer.

However, a large-area polarizer can be obtained using a method of nano-patterning block copolymers by forming a thickness gradient in the block copolymers and aligning the block copolymers in a desired direction according to the present technical concept, without using expensive equipment such as a conventional vacuum depositor.

Hereinafter, a method of manufacturing a polarizer using nano-patterning in which block copolymers are aligned in a desired direction by forming a thickness gradient will be described.

FIGS. 10A through 10D show a method of manufacturing a polarizer by combining desired metal particles with one of the blocks in the block copolymers, forming a thickness gradient, and nano-patterning the block copolymers.

Figure 10A:
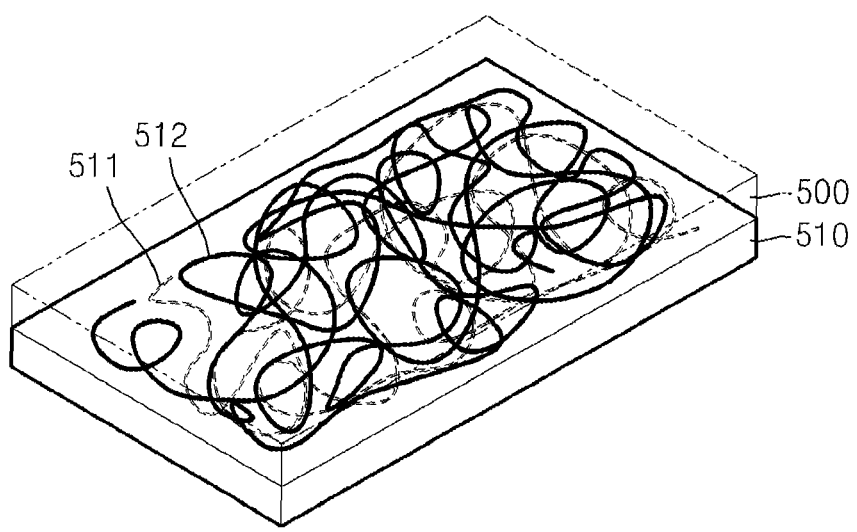
FIGS. 10A through 10D show a method of manufacturing a polarizer by combining desired metal particles with one of the blocks in the block copolymers, forming a thickness gradient, and nano-patterning the block copolymers.

Referring to FIG. 10A, a block copolymer 500 including block A 511 and block B 512 is coated on a substrate 510 to a predetermined thickness. One of the block A 511 and the block B 512 is combined with a metal. In this embodiment, the block A is combined with the metal particles.

Methods of combining the metal particles with one of the blocks are classified in in-situ methods and an ex-situ methods. According to the in-situ method, an inorganic precursor material is added to the block copolymers. According to the ex-situ method, the surface of the metal particles is adjusted, and then the metal particles are mixed with the block to be selectively inserted into a target region. The in-situ and ex-situ methods are well known in the art as methods of combining the metal particles with the block, and thus detailed descriptions thereof are omitted herein.

Figure 10B:
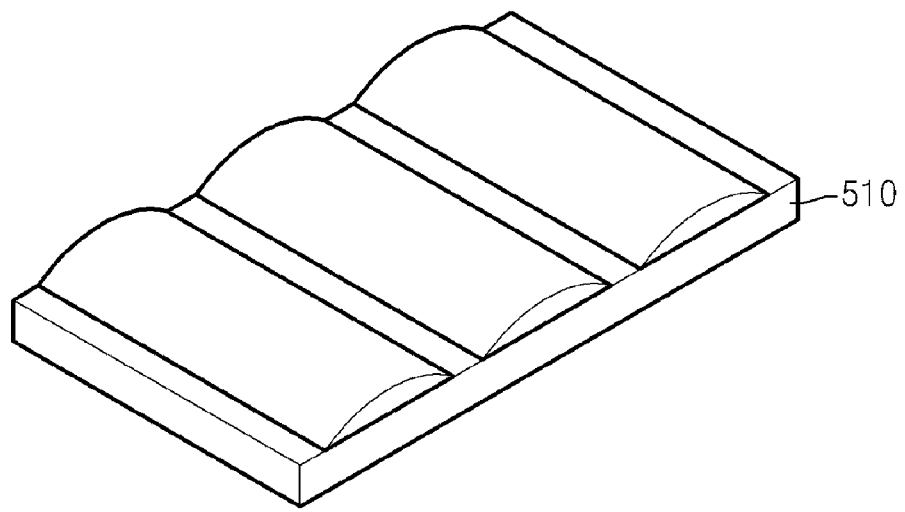

Referring to FIG. 10B, the block copolymer 500 has a thickness gradient. Methods of forming the thickness gradient may include a method of pinning and depinning as shown in FIG. 1 and a method of nano-imprinting shown in FIG. 7, which will not be described again.

Figure 10C:
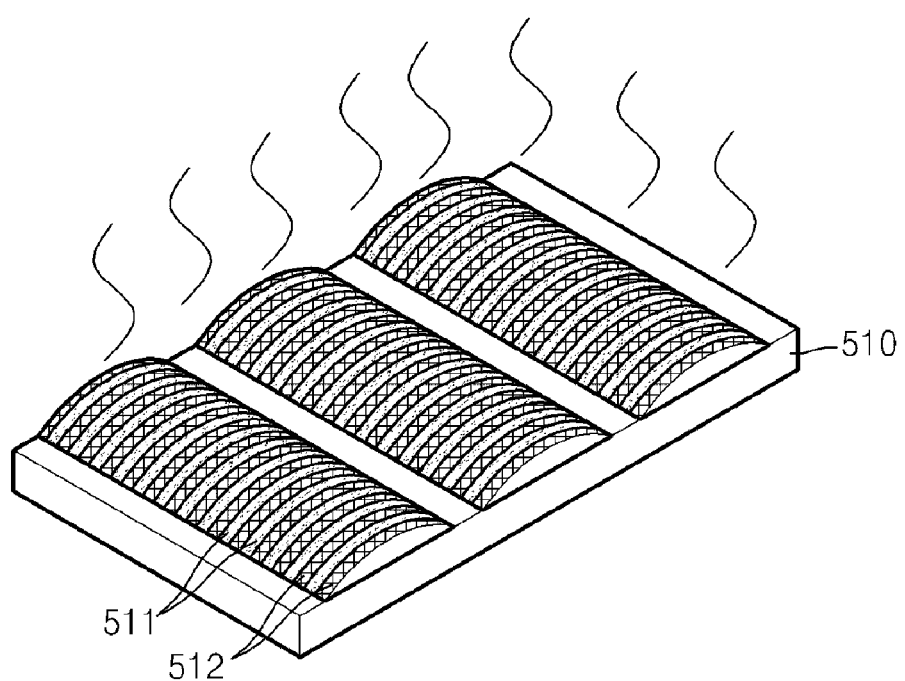

Referring to FIG. 10C, the block copolymer 500 having a thickness gradient is heat-treated to align the block A 511 and the block B 512 along a lengthwise direction of the thickness gradient. The method has been described above with reference to FIGS. 1 and 2.

Figure 10D:
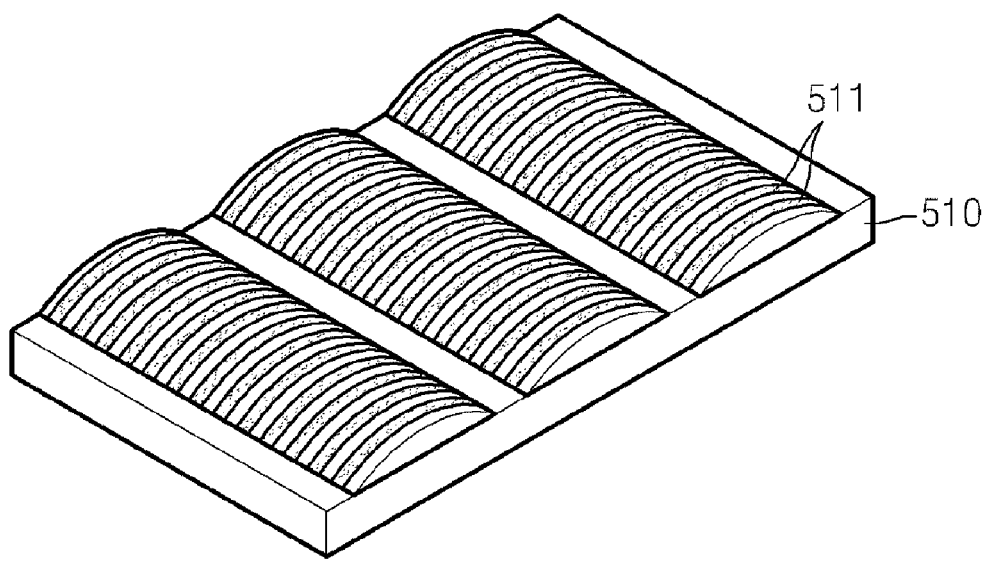

Referring to FIG. 10D, the block B 512 is removed using etch or other methods except the block A 511 with which a metal is combined. When the block B 512 is removed, the remained block A 511 functions as the wire grid 420 shown in FIG. 9. Thus, a polarizer in which a plurality of block As 511, which are combined with the metal, are arranged at predetermined intervals on the substrate 510 is prepared.

FIGS. 11A through 11G show a method of manufacturing a polarizer by forming a thickness gradient in block copolymers, nano-patterning the block copolymers, and substituting one of the blocks in the block copolymers with a metal.

Figure 11A:
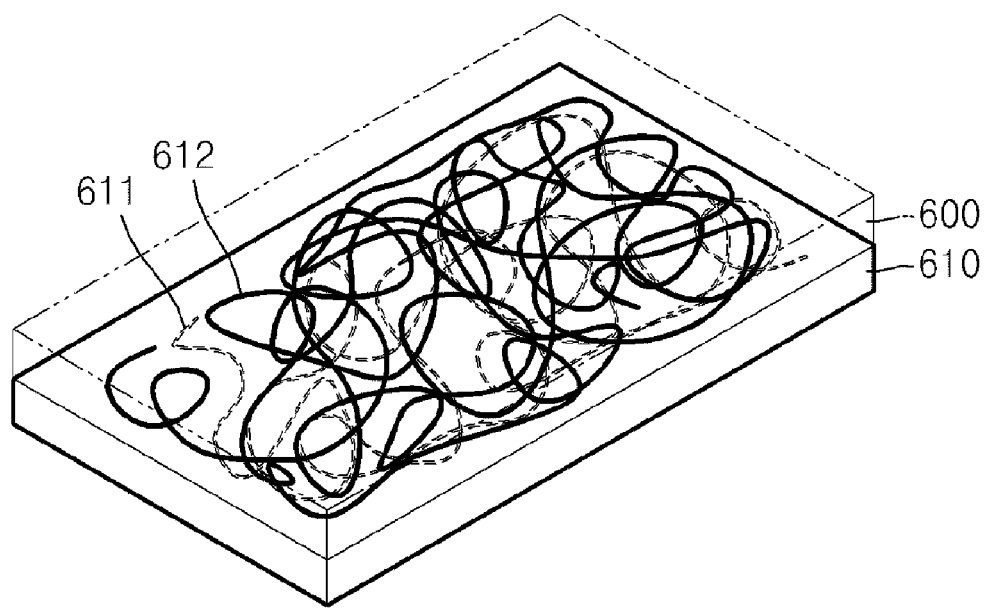
FIGS. 11A through 11G show a method of manufacturing a polarizer by forming a thickness gradient in block copolymers, nano-patterning the block copolymers, and substituting one of the blocks in the block copolymers with a metal.

Referring to FIG. 11A, a block copolymer 600 including block A 611 and block B 612 is coated on a substrate 610 to a predetermined thickness.

Figure 11B:
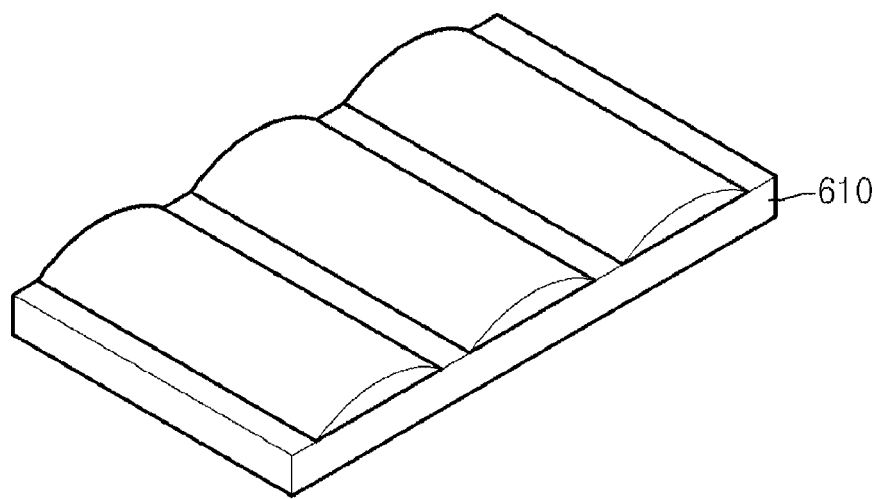

Referring to FIG. 11B, the block copolymer 600 has a thickness gradient. The method of forming the thickness gradient may be a method of pinning and depinning as shown in FIG. 1 and a method of nano-imprinting shown in FIG. 7, which will not be described again.

Figure 11C:
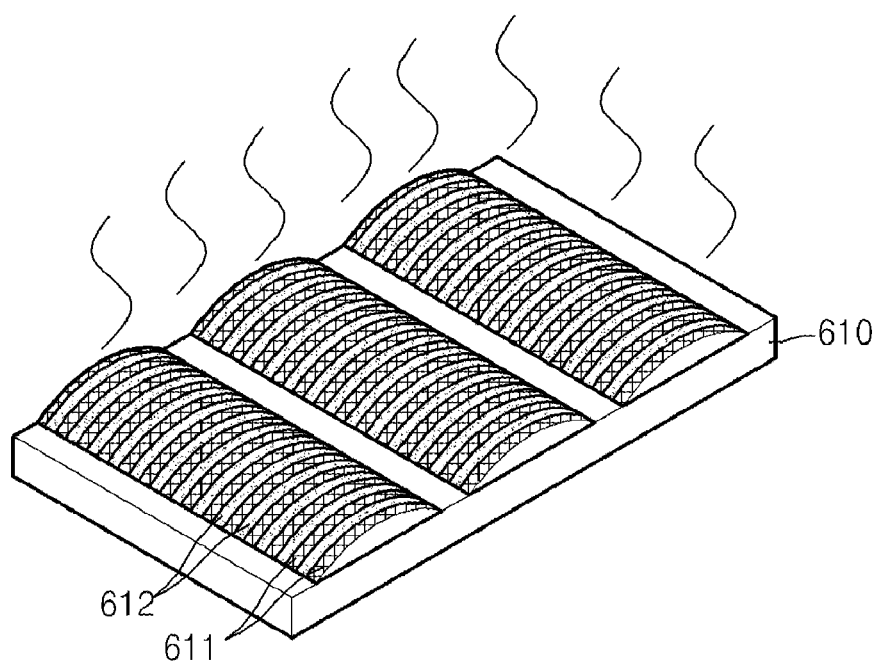

Referring to FIG. 11C, the block copolymer 600 having a thickness gradient is heat-treated to align the block A 611 and the block B 612 along a lengthwise direction of the thickness gradient. The heat-treatment method has been described above with reference to FIGS. 1 and 2.

Figure 11D:
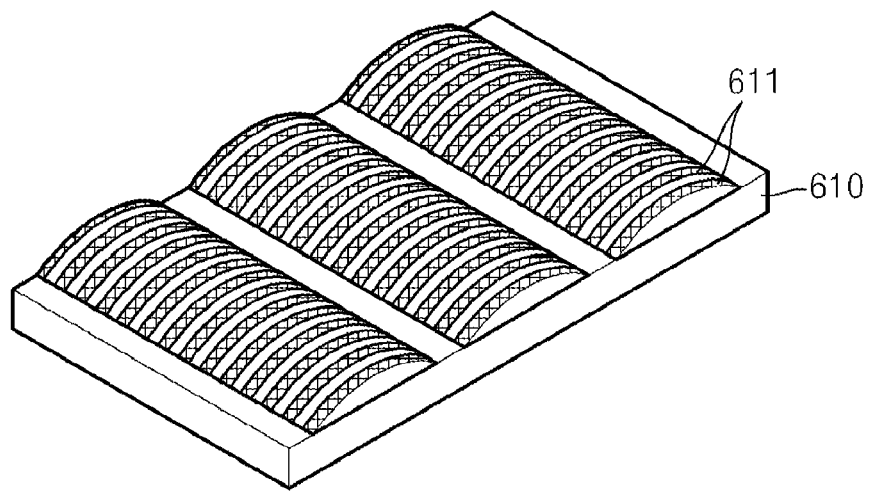

Referring to FIG. 11D, the block B 612 is removed using etch or other methods and the block A 611 remains on the substrate 610.

Figure 11E:
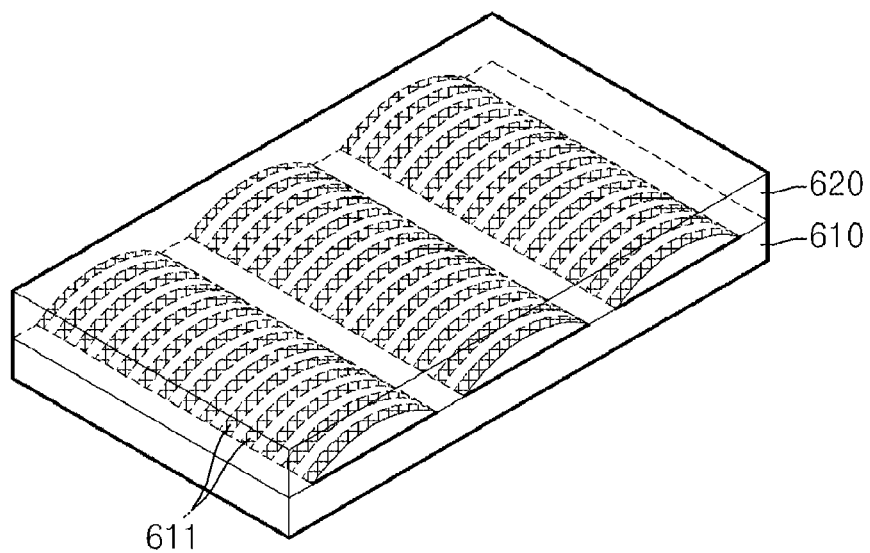

Referring to FIG. 11E, a metal material layer 620 is coated on the substrate 610 on which the block A 611 is arranged to a predetermined thickness. Then, the metal material is filled in empty space from which the block B 612 was removed between the block As 611.

Figure 11F:
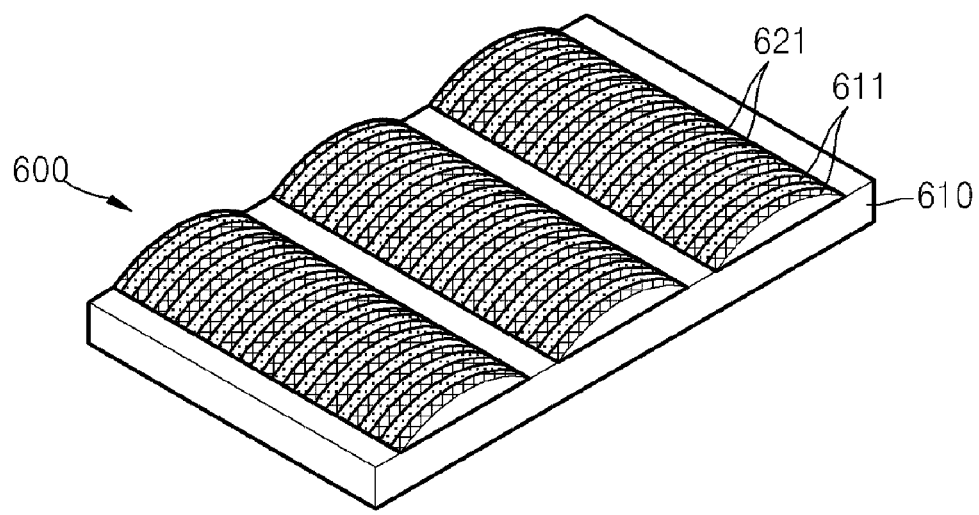
Figure 11G:
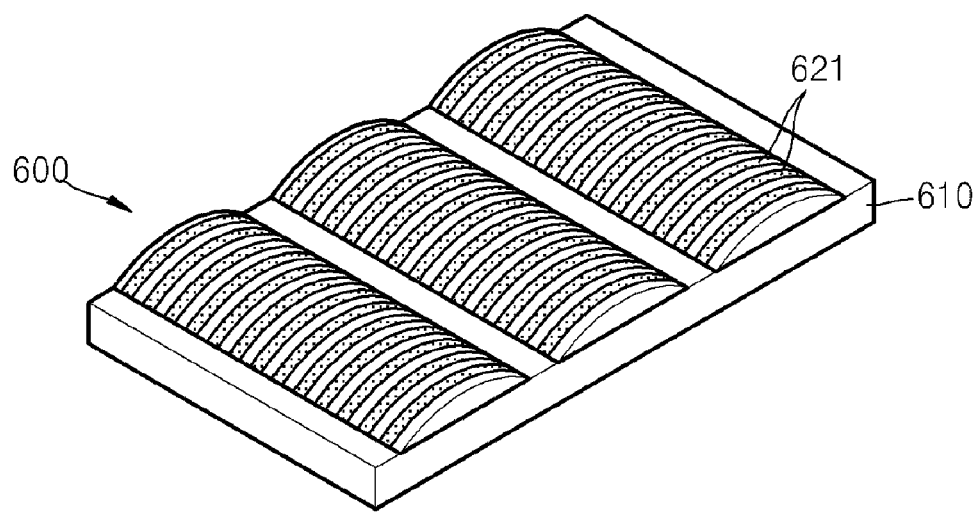

Referring to FIGS. 11F and 11G, the metal material layer 620 is patterned to correspond to the height of the block A 611 using a lift off process, and then the block A 611 is removed. Thus, a polarizer in which a wire grid 621 formed of a metal material are arranged at predetermined intervals on the substrate 610 is manufactured. The lift off process is a known technology, and thus is not described herein.

FIGS. 12A through 12E show a method of manufacturing a polarizer by forming a thickness gradient in block copolymers, nano-patterning the block copolymers and plating sites in which the blocks are removed.

Figure 12A:
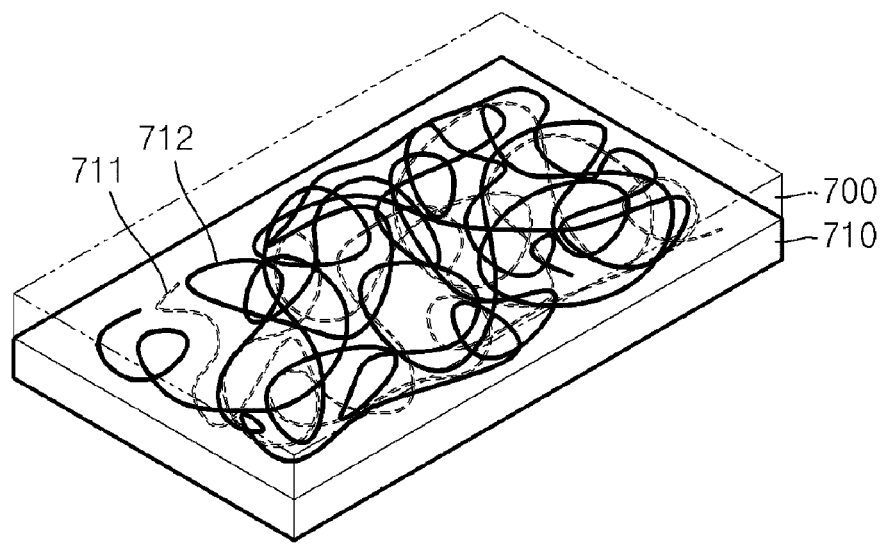
FIGS. 12A through 12E show a method of manufacturing a polarizer by forming a thickness gradient in block copolymers, nano-patterning the block copolymers and plating sites from which the blocks were removed with a metal.

Referring to FIG. 12A, a block copolymer 700 including block A 711 and block B 712 is coated on a substrate 710 to a predetermined thickness.

Figure 12B:
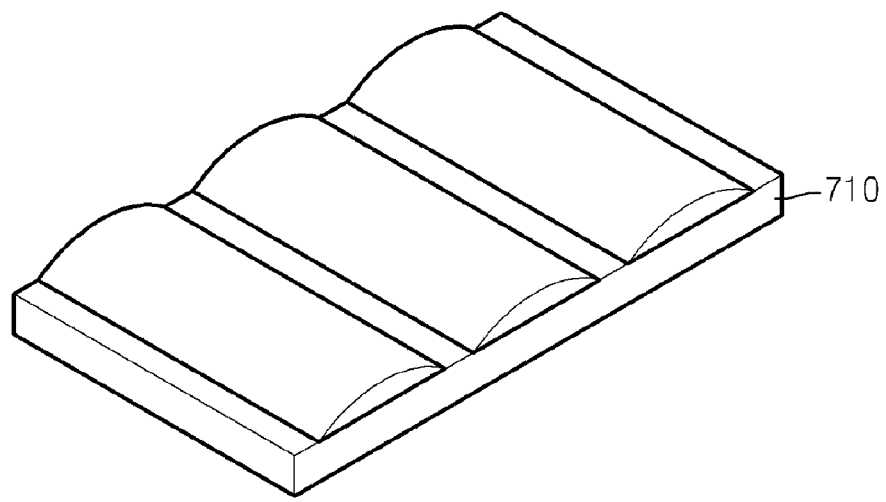

Referring to FIG. 12B, the block copolymer 700 has a thickness gradient. The method of forming the thickness gradient may be a method of pinning and depinning as shown in FIG. 1 and a method of nano-imprinting shown in FIG. 7, which will not be described again.

Figure 12C:
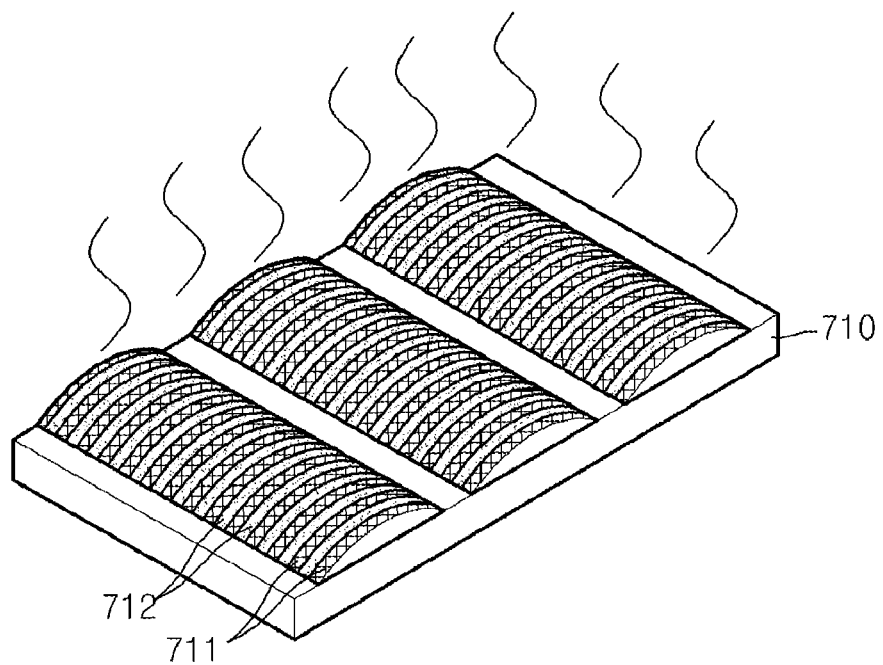

Referring to FIG. 12C, the block copolymer 700 having a thickness gradient is heat-treated to align the block A 711 and the block B 712 along a lengthwise direction of the thickness gradient. The heat-treatment method has been described above with reference to FIGS. 1 and 2.

Figure 12D:
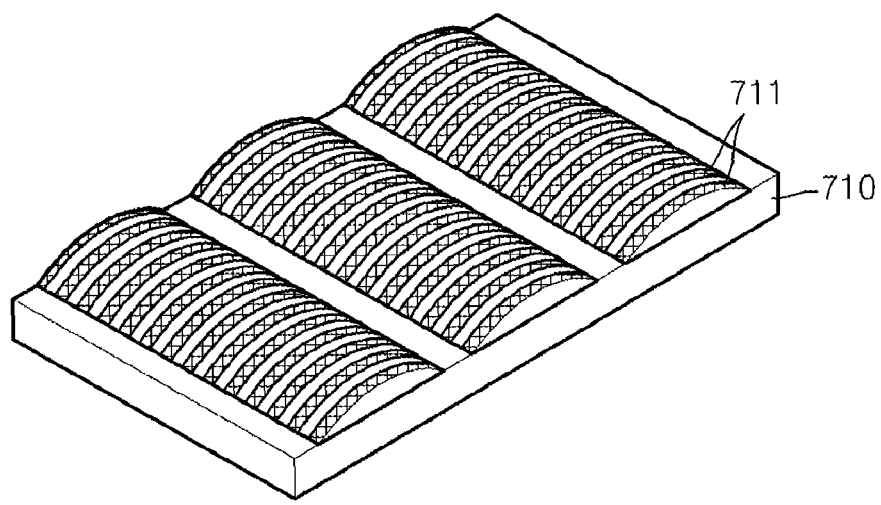

Referring to FIG. 12D, the block B 712 is removed using etch or other methods, and the block A 711 remains on the substrate 710.

Figure 12E:
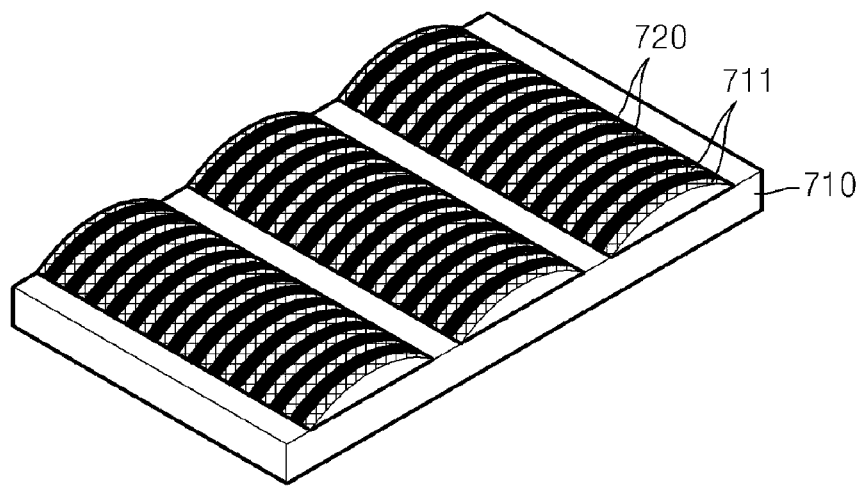

Referring to FIG. 12E, a metal material is filled in empty space in which the block B 712 is removed between the block As 711 to form a wire grid 720 using electroplating. Even though the block A 711 remains, the polarizer is not inhibited.

A metal such as Au may be interposed between the substrate 710 and the block A 711 in order to perform electroplating. Electroplating is a known technology, and thus is not described herein.

FIGS. 13A through 13D show a method of forming a polarizer manufactured by forming a thickness gradient in block copolymers and nano-patterning the block copolymers on a color filter.

An LCD mainly includes a back light, liquid crystal, and a color filter, wherein the liquid crystal includes a polarizer or a polarizer film on the both sides. Since the constitution of the LCD can be simplified when a polarizer is formed in a color filter, a polarizer is formed in black matrixes of the color filter using a method of nano-patterning the block copolymer by forming a thickness gradient in the block copolymer.

Figure 13A:
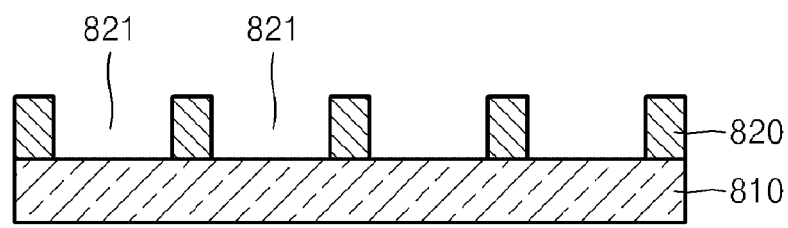
FIGS. 13A through 13D show a method of forming a polarizer manufactured by forming a thickness gradient in block copolymers and nano-patterning the block copolymers on a color filter.

Referring to FIG. 13A, a plurality of black matrixes are formed on a transparent substrate 810 using photolithograpy. A space 821 between the black matrixes 820 is filled with ink, and a pixel is formed by filling a red R, a green G and a blue B inks in three spaces 821.

Figure 13B:
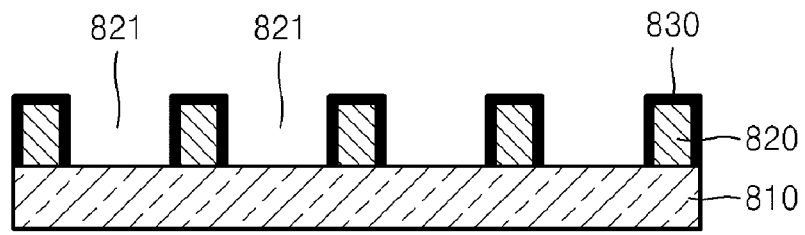

Referring to FIG. 13B, a hydrophobic layer 830 may be formed to surround the black matrixes 820. A contact angle between the block copolymer and the hydrophobic layer 830 increases since the block copolymer does not have affinity to the hydrophobic layer 830, and thus a thickness gradient is formed in the block copolymer.

Figure 13C:
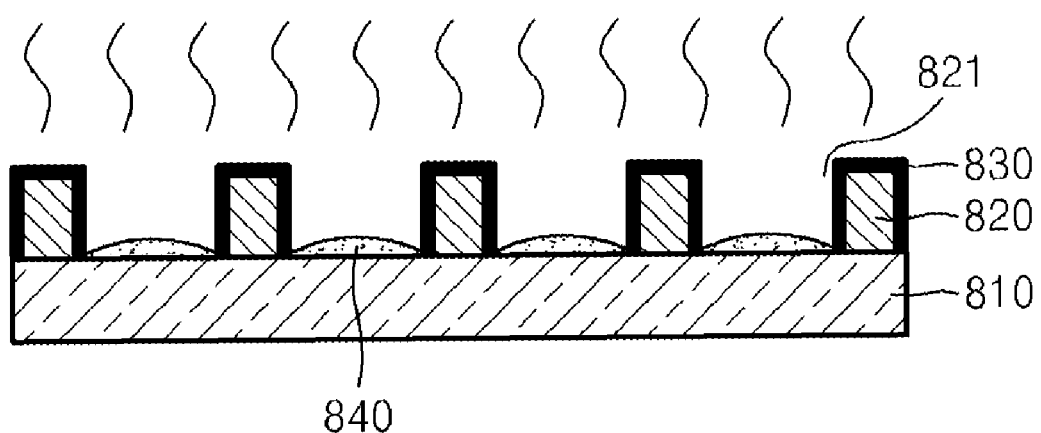

Referring to FIG. 13C, a block copolymer 840 is filled in the empty space 821. A contact angle between the block copolymer 840 and the hydrophobic layer 830 increases, and thus a thickness gradient is formed in the block copolymer. When heat is applied to the block copolymer 840, the block copolymer 840 is aligned in a direction of the thickness gradient. Then, a polarizer is manufactured using one of the methods shown in FIGS. 10 through 12. The methods are described above with reference to FIGS. 1, 2, and 10 through 12.

Figure 13D:
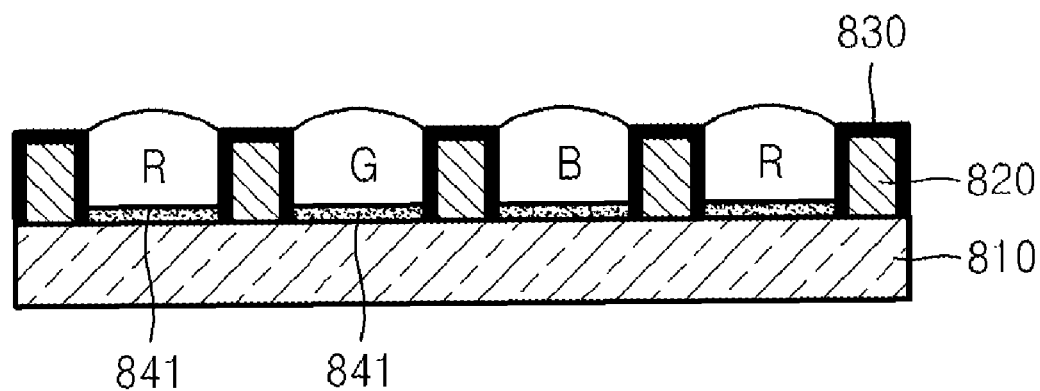

Referring to FIG. 13D, a polarizer 841 is formed in the space 821 defined by the black matrixes 820, and a color filter is prepared by filling a red R, a greed G and a blue B inks in the black matrixes 820.

The method of nano-patterning block copolymers and a method of manufacturing a polarizer and a color filter using the same according to the present technical concept are economical since a large area can be nano-patterned by forming a thickness gradient in the block copolymers and aligning the block copolymers in one direction. The area of the polarizer can be minimized since a period of the polarizer is reduced by manufacturing the polarizer using a method of nano-patterning block copolymers. The color filter can be small-sized since a thickness of the color filter is reduced by manufacturing the polarizer in the black matrixes.

While the present technical concept has been particularly shown and described with reference to exemplary embodiments thereof, it will be understood by those of ordinary skill in the art that various changes in form and details may be made therein without departing from the spirit and scope of the present technical concept as defined by the following claims.

What is claimed is:

1. A method of nano-patterning block copolymers, the method comprising:
   (a) coating block copolymers on a lower substrate to a predetermined thickness;
   (b) forming a thickness gradient by patterning the block copolymers to have a predetermined aspect ratio; and
   (c) aligning self-assembled block copolymers in a direction of the thickness gradient by heat-treating the block copolymers having the thickness gradient.

2. The method of claim 1, wherein in operation (b), the thickness gradient of the block copolymers is formed by contacting the block copolymers with an upper substrate and repeatedly pinning and depinning the upper substrate at a predetermined speed.

3. The method of claim 2, wherein the upper substrate is moved toward a direction of forming the thickness gradient in the block copolymers.

4. The method of claim 1, wherein in operation (b), a thickness gradient of the block copolymers is formed by nano-imprinting a module having a pattern of the thickness gradient on the block copolymers.

5. The method of claim 1, wherein in operation (b), an aspect ratio is in the range of 1:200 to 1:1.

6. The method of claim 1, wherein in operation (c), the heat-treatment is performed at a temperature less than a glass transition temperature.

7. A method of nano-patterning block copolymers, the method comprising:
   (a) coating a sacrificial layer on a lower substrate;
   (b) patterning a plurality of barrier ribs and channels on the sacrificial layer using a photomask;
   (c) forming a plurality of barrier ribs and channels by etching the sacrificial layer;
   (d) forming a hydrophobic layer to surround the plurality of the barrier ribs;
   (e) forming a thickness gradient by filling block copolymers in the plurality of channels to have a predetermined aspect ratio; and
   (f) aligning self-assembled block copolymers in a direction of the thickness gradient by heat-treating the block copolymers having the thickness gradient.

8. The method of claim 7, wherein in operation (e), an aspect ratio is in the range of 1:200 to 1:1.

9. The method of claim 7, wherein in operation (f), the heat-treatment is performed at a temperature less than a glass transition temperature.

10. A method of manufacturing a polarizer, the method comprising:
   (a) coating block copolymers including a block combined with a metal on a substrate;
   (b) forming a thickness gradient by patterning the block copolymers to have a predetermined aspect ratio;
   (c) aligning self-assembled block copolymers in a direction of the thickness gradient by heat-treating the block copolymers having the thickness gradient; and
   (d) removing blocks other than the block combined with particles of the metal.

11. The method of claim 10, wherein in operation (b), the thickness gradient of the block copolymers is formed by contacting the block copolymers with an upper substrate and repeatedly pinning and depinning the upper substrate at a predetermined speed.

12. The method of claim 10, wherein in operation (b), a thickness gradient of the block copolymers is formed by nano-imprinting a module having a pattern of the thickness gradient on the block copolymers.

13. The method of claim 10, wherein in operation (b), an aspect ratio is in the range of 1:200 to 1:1.

14. The method of claim 10, wherein in operation (c), the heat-treatment is performed at a temperature less than a glass transition temperature.

15. A method of manufacturing a polarizer, the method comprising:
   (a) coating block copolymers in which at least two blocks are combined on a substrate;
   (b) forming a thickness gradient by patterning the block copolymers to have a predetermined aspect ratio;
   (c) aligning self-assembled block copolymers in a direction of the thickness gradient by heat-treating the block copolymers having the thickness gradient;
   (d) removing one of the blocks included in the block copolymers;
   (e) coating a metal material layer to a predetermined thickness on the block copolymers from which one of the blocks was removed;
   (f) patterning the metal material layer using a lift off process; and
   (g) removing the other blocks.

16. The method of claim 15, wherein in operation (b), the thickness gradient of the block copolymers is formed by contacting the block copolymers with an upper substrate and repeatedly pinning and depinning the upper substrate at a predetermined speed.

17. The method of claim 15, wherein in operation (b), a thickness gradient of the block copolymers is formed by nano-imprinting a module having a pattern of the thickness gradient on the block copolymers.

18. The method of claim 15, wherein in operation (b), an aspect ratio is in the range of 1:200 to 1:1.

19. The method of claim 15, wherein in operation (c), the heat-treatment is performed at a temperature less than a glass transition temperature.

20. A method of manufacturing a polarizer, the method comprising:
   (a) coating block copolymers in which at least two blocks are combined on a substrate;
   (b) forming a thickness gradient by patterning the block copolymers to have a predetermined aspect ratio;
   (c) aligning self-assembled block copolymers in a direction of the thickness gradient by heat-treating the block copolymers having the thickness gradient;
   (d) removing one of the blocks included in the block copolymers; and
   (e) electroplating a portion from which the block was removed.

21. The method of claim 20, wherein in operation (b), the thickness gradient of the block copolymers is formed by contacting the block copolymers with an upper substrate and repeatedly pinning and depinning the upper substrate at a predetermined speed.

22. The method of claim 20, wherein in operation (b), a thickness gradient of the block copolymers is formed by nano-imprinting a module having a pattern of the thickness gradient on the block copolymers.

23. The method of claim 20, wherein in operation (b), an aspect ratio is in the range of 1:200 to 1:1.

24. The method of claim 20, wherein in operation (c), the heat-treatment is performed at a temperature less than a glass transition temperature.

25. A method of manufacturing a color filter, the method comprising:
   (a) forming black matrixes on a substrate;
   (b) forming a hydrophobic layer to surround the black matrixes;
   (c) forming a thickness gradient to have a predetermined aspect ratio by filling block copolymers in space defined by the black matrixes;
   (d) aligning self-assembled block copolymers in a direction of the thickness gradient by heat-treating the block copolymers having the thickness gradient;
   (f) removing one of the blocks included in the block copolymers and forming a polarizer; and
   (g) filling a color ink in the space in which the polarizer is formed.

26. The method of claim 25, wherein in operation (f), blocks other than the blocks combined with particles of a metal are removed.

27. The method of claim 25, wherein in operation (f), a metal material layer is filled in empty space from which the blocks were removed.

28. The method of claim 27, wherein the metal material layer is filled in empty space in which the blocks are removed using electroplating.

29. The method of claim 25, wherein in operation (b), the thickness gradient of the block copolymers is formed by contacting the block copolymers with an upper substrate and repeatedly pinning and depinning the upper substrate at a predetermined speed.

30. The method of claim 25, wherein in operation (b), a thickness gradient of the block copolymers is formed by nano-imprinting a module having a pattern of the thickness gradient on the block copolymers.

31. The method of claim 25, wherein in operation (b), an aspect ratio is in the range of 1:200 to 1:1.

32. The method of claim 25, wherein in operation (c), the heat-treatment is performed at a temperature less than a glass transition temperature.

* * * * *